United States Patent [19]

Reng

[11] Patent Number: 4,511,978
[45] Date of Patent: Apr. 16, 1985

[54] DEVICE FOR DETERMINING A PARAMETER SIGNAL FOR A VOLTAGE-FED LOAD

[75] Inventor: Leonhard Reng, Erlangen, Fed. Rep. of Germany

[73] Assignee: Siemens Aktiengesellschaft, Berlin and Munich, Fed. Rep. of Germany

[21] Appl. No.: 386,946

[22] Filed: Jun. 10, 1982

[30] Foreign Application Priority Data

Jun. 30, 1981 [DE] Fed. Rep. of Germany ....... 3125748

[51] Int. Cl.³ .............................................. G06G 7/62
[52] U.S. Cl. ................................... 364/480; 318/803; 318/808
[58] Field of Search ........................ 364/480, 481, 483; 318/317, 803, 808

[56] References Cited

U.S. PATENT DOCUMENTS

| 4,088,935 | 5/1978 | D'Atre et al. | 318/808 X |
| 4,280,085 | 7/1981 | Cutler et al. | 318/803 |
| 4,282,473 | 8/1981 | Dreiseitl et al. | 318/803 |
| 4,335,343 | 6/1982 | Dreiseitl et al. | 318/803 X |
| 4,441,065 | 4/1984 | Bayer et al. | 318/808 |

Primary Examiner—Edward J. Wise
Assistant Examiner—Edward R. Cosimano
Attorney, Agent, or Firm—F. W. Powers; J. L. James

[57] ABSTRACT

A device for determining a load operating parameter signal, such as the flux of a rotary field machine, has an integrating circuit added at the input of the instrument transformer with a transfer function $k/(1+s\cdot k/\omega_N)$ that amplifies reduced low frequency load voltage inputs to the transformer to avoid calculation inaccuracies due to the transformer transfer error. Circuitry having the inverse transfer function located at the output of the transformer compensates for the amplification distortion.

6 Claims, 2 Drawing Figures

DEVICE FOR DETERMINING A PARAMETER SIGNAL FOR A VOLTAGE-FED LOAD

BACKGROUND OF THE INVENTION

1. Field of the Invention

This invention relates to a device for determining an operating parameter signal for a load fed by a voltage, such as for determining a flux signal for a rotary field machine.

2. Description of the Prior Art

To determine an operating parameter from a harmonic-affected or otherwise disturbed a-c voltage in a computing circuit (e.g. to form a load control signal from the feed voltage of a connected load in a control system), smoothers are often used which have undiminished transmittance for low frequency voltages, but which damp high frequencies. Such smoothers have a frequency response $1/(1+s\,t)$, with a time constant $t$ and a laplacian operator $s$, and are generally designed as integrating circuits having resistors connected in parallel with the integrating capacitors. Besides damping the undesired harmonics, however, smoothers of this type bring about a phase shift of the a-c voltage. This shift must be accepted, since a transfer stage with the transfer function $(1+s\,t)$ needed to compensate for it, would in turn amplify the damped harmonics again.

It is gnerally not possible to apply the load voltage on which the calculation of the parameter is based directly to the computing circuit. On the one hand, a d-c isolation of the computing circuit from the voltage network is required, and on the other hand, the operational amplifiers and other components used in the computing circuit operate at a relatively low voltage level which usually lies considerably below the load voltage level. For this reason, transformer circuitry is required between the voltage network and the computing circuit to provide d-c isolation and an appropriate response ratio.

For a rotary machine voltage-fed load, good operating control of the machine can be achieved using a magnetic flux signal formed by integrating the machine EMF. The EMF can be calculated from the machine voltage and, optionally, also taking into consideration the ohmic stator voltage drop caused by the stator current I and of the inductive stray voltage from the machine current, according to the equation $$\psi = \int (U - r \cdot I)dt - x \cdot I,$$

where $r$ and $x$ denote the machine parameters for the ohmic stator resistance and the stray inductance. Both the magnitude and the direction of flux are determined by treating $\psi$, U and I as vectors and evaluating the equation separately for the separate components of those vectors. To this end, for each component an integrating circuit is used to which the difference $U - r\,I$ of the respective vector components is supplied. The product $-x \cdot I$ can then be imposed on the output of the integrator at a summing point, to take into consideration the inductive stray voltage as described in commonly-owned, U.S. Pat. No. 4,335,343.

With the aid of the flux parameter signal thus determined, the rotary field machine can be controlled in such a way that by presetting the stator current component parallel to the flux, the flux can be maintained at a given (i.e. a constant) desired value, while the torque can be controlled by monitoring the component perpendicular to the flux (so-called "field-oriented operation" of the machine).

A current measuring device connected to the machine terminal serves to supply the integrating circuit with a signal correlated with the ohmic stator resistance voltage drop $r \cdot I$. During normal machine operation, the magnitude I of the stator current changes little, so that the level of this signal is always considerably greater than the magnitude of measurement error of the current sensing device. The device also provides for d-c isolation of the integrating circuit from the machine terminals. The machine voltage U is detected by a measurement transformer which under d-c isolation from the motor terminals has a transfer ratio adapted to the proportionality factor of the current sensor. The outputs of the current measuring device and voltage detector are processed by the integrator. The integrator performs the integration of $u' - r \cdot i'$ and optionally takes into account a quantity $x \cdot i'$ (also developed by the current sensor) to form a flux signal $\psi$ which is proportional to the respective components of the actual flux $\psi = \omega_N \int (U - r \cdot I)dt - x \cdot I$. When the flux $\psi$ is being maintained at a relatively high desired value the stator voltage must be correspondingly decreased for decreasing frequency. As the rotational speed approaches the lower limit of the intended normal operating frequency range, the load voltage level may drop to such an extent that a d-c component of magnitude $u'$ (caused, for example, by the offset voltage and measurement errors of the instrument transformer) will lead to such inaccuracies in the input value $u'$ and the calculated value that proper control of the machine will no longer be possible.

SUMMARY OF THE INVENTION

It is an object of the invention to provide an improved device for determining an operatng parameter signal for a voltage-fed load, wherein the influence of the transfer error of the instrument transformer is minimized even at low frequencies.

According to the invention, a device for determining an operating parameter signal for a voltage-fed load includes an integrating circuit connected at the load voltage detecting input of a transformer and having a transfer function that provides greater amplification for reduced low frequency voltages than for high frequency voltages. Suitable circuitry placed after the transformer having the inverse transfer functionn provides compensation for the amplification.

An integrating circuit proceding the instrument transformer having a transfer function $k/(1+s\,k/\omega_N)$ has an amplitude response for which voltages up to a frequency $\omega_N/k$ are amplified by the factor k, while at higher frequencies the amplification factor decreases linearly. The integrating circuit is constructed so that even at very low load voltage levels the signal at the input of the instrument transformer is sufficiently strong relative to the transfer error. A circuit arrangement having the inverse transfer function is disposed after the output of the instrument transformer to eliminate the distortion of the load voltage level caused by the preceding integrating circuit and at the same time to compensate for any phase shift that may have been caused. This latter circuit arrangement may be realized as a separate component or may be consolidated into an integrating circuit, if any, that may be contained in this circuit.

This arrangement provides a proportionality constant between the load voltage and the output signal of the instrument transformer which varies with frequency. This range variation is obtained, not intermittently by switching, but continuously and without any switching in the wiring of the instrument transformer.

There have thus been outlined rather broadly the more important objects, features and advantages of the invention in order that the detailed description thereof that follows may be better understood, and in order that the present contribution to the art may be better appreciated. There are, of course, additional features of the invention that will be described more fully hereinafter. Those skilled in the art will appreciate that the conception on which this disclosure is based may readily be utilized as the basis for the designing of other arrangements for carrying out the purposes of this invention. It is important, therefore, that this disclosure be regarded as including such equivalent arrangements as do not depart from the spirit and scope of the invention.

BRIEF DESCRIPTION OF THE DRAWINGS

Embodiments of the invention have been chosen for purposes of illustration and description, and are shown in the accompanying drawings forming a part of the specification, wherein.

Like elements are referred to by like numerals throughout the drawings.

DESCRIPTION OF PREFERRED EMBODIMENTS

Figure 1:
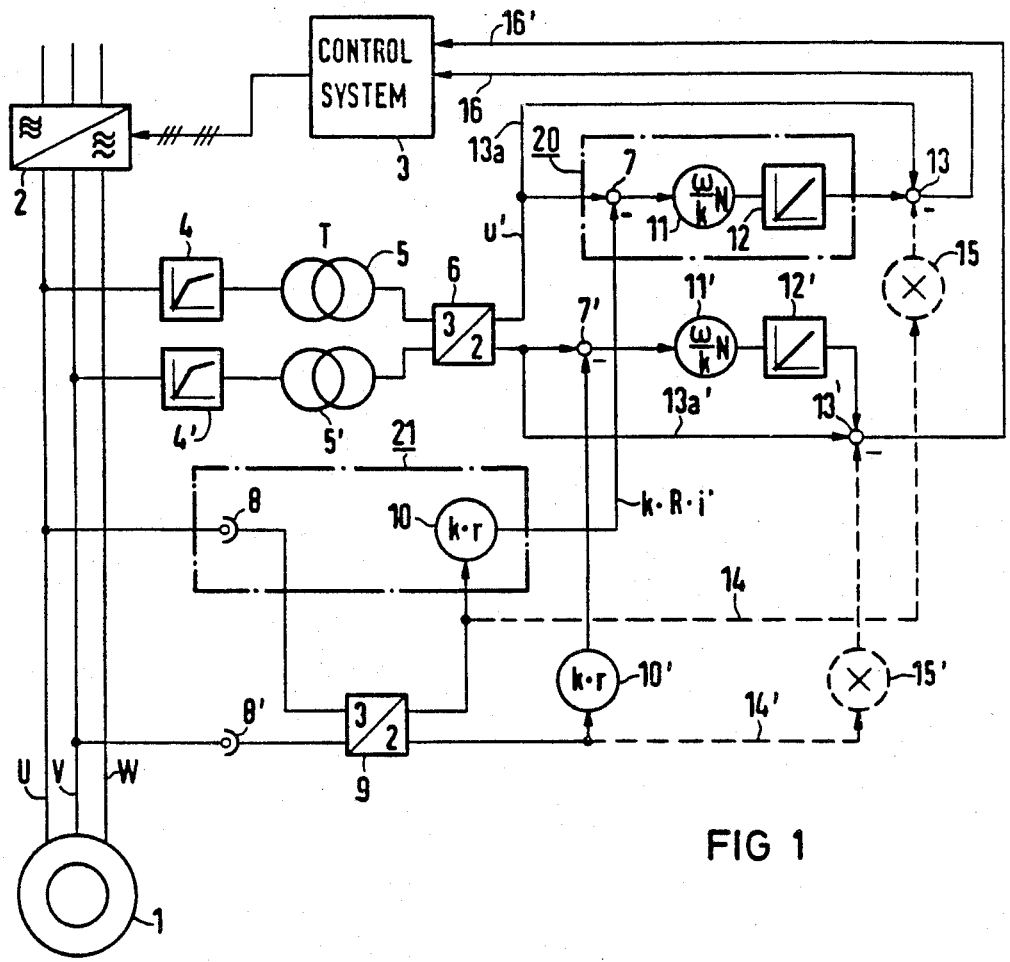
FIG. 1 is a schematic circuit diagram of an embodiment of the invention in the form of a flux computer used to calculate the flux of a rotary field machine.

As shown in FIG. 1, a rotary field machine 1 receives electricity at its terminals U, V and W from a frequency converter 2 connected to a three-phase network. The converter 2 receives control signals for its output control from a control system 3. For field-oriented operation of the rotary field machine 1, the control system 3 is connected to receive information about the magnitude and direction of the magnetic flux. The flux information is developed from an integration of the EMF induced by the rotary field machine 1, and is obtained from the stator voltage U and the stator current I, taking into account the ohmic stator voltage drop produced by the stator current at the stator resistance r and the stray voltage occurring at the stray inductance x. The stator current and stator voltage can be combined in known manner from the phase currents and phase voltages to a resultant current vector or voltage vector, so that there applies for the flux the vectorial equation $$\psi = \int (U - r \cdot I) dt - x \cdot I \quad (1)$$

These vectors can be broken down into components, denoted by the indices $\alpha$ and $\beta$ in a fixed Cartesian coordinate system resulting in the following two component equations:

$$\psi_{\alpha} = \int (U_{\alpha} - r \cdot I_{\alpha}) dt - x \cdot I_{\alpha} \quad (2)$$

$$\psi_{\beta} = \int (U_{\beta} - r \cdot I_{\beta}) dt - x \cdot I_{\beta} \quad (3)$$

For the calculation of these two components, the voltages are tapped at two phases U and V of the stator winding and are respectively supplied by means of integrating circuits 4, 4' to instrument transformers 5, 5' (see FIG. 1). The direction and magnitude of a voltage vector correlated with the stator voltage vector U is thus determined. From these, a translator component 6 forms the Cartesian components of a corresponding vector U', and supplies the separate components respectively to summing points 7, 7'.

The currents in the phases U and V are tapped by means of current transformers 8, 8' and are likewise transformed through a component translator 9 into signals representing the Cartesian components of a current vector I' which is proportional to the stator current vector I. These two Cartesian coordinate signals are respectively applied negatively to the summing points 7, 7' through proportional stages 10, 10' (FIG. 1). The outputs of the summing points 7, 7' are supplied to the input of integrators 12, 12' through proportional stages 11, 11'. The output value of each integrator 12, 12' is superposed at a corresponding summing point 13, 13' onto the respective component of the voltage vector U' output of the coordinate translator 6 delivered to the points 13, 13' by the signal lines 13a, 13a'. The respective component output signals of the current vector I' tapped at the coordinate translator 9 may optionally also be supplied to the summing points 13, 13' via lines 14, 14' and additional proportional stages 15, 15' (as shown by dashed lines in FIG. 1). The output signals of the summing points 13, 13' are delivered on the lines 16, 16' to the control system 3.

For clarity in understanding the invention, consider first that the integrating and amplifying circuits 4, 4' and the lines 13a, 13a' leading from the coordinate translator 6 to the summing points 13, 13' are disregarded and that a constant signal weighting factor $k=1$ is applied at the proportional stages 11, 11'. With these modifications, the arrangement shown in FIG. 1 would correspond to the device described in copending U.S. Pat. No. 4,335,343, in which there is further provided a special zero point control for the integrators 12, 12' which is also advantageous to use with the integrators 12, 12' shown in FIG. 1.

A detailed discussion of the operation of the coordinate translators 6, 9, is unnecessary to an understanding of the invention. These elements merely serve to form the Cartesian components of the voltage and current vectors U', I' from the respective measured values of the phase voltages and phase currents in accordance with well-known techniques. Since in general the translators contain operational amplifiers which operate at voltage levels that are relatively low compared to the phase voltages, they are, of course, advantageously arranged on the output side of the transformers. The transformers serve on the one hand to provide d-c isolation from the stator voltage to the remaining circuitry; and, on the other hand, to adapt the stator voltage level to a level usable by the other components. The transfer ratio of the instrument transformers 5, 5' is designated in FIG. 1 by the letter T. Theoretically, the Cartesian components can also be formed directly from the phase voltages, in which case the component translator 6 can be disposed at the inputs of either the instrument transformers or of the integrating and amplifying circuits, if desired. If the integrating circuits 4, 4' are disregarded, the transformed voltage vector U' can be expressed as $$U' = T \cdot U.$$

For the current transformers 8, 8' the same proportionality between input and output signal may be assumed, and the proportionality or weighting factor of the proportional stages 10, 10' can be selected to correspond to the stator resistance parameter r of the machine 1. The setting of the proportionality factor r or k r may also be effected by appropriate selection of the current transformers 8, 8' or of the coordinate translator 9, i.e. without proportional stages of their own.

When the effects of the elements 4, 4', 13a and 13a' are ignored and k is taken as k=1, a flux signal is developed at the summing point 13 from the output of the integrator 12 and the optional addition of the output of the proportional stage 15 (whose constant is set to the parameter x of the rotary field machine stray inductance) whose magnitude is given by the expression $$\psi'_\alpha = \omega_N \cdot \int (U_\alpha - r \cdot I_\alpha)dt - x \cdot I_\alpha$$

which (in accordance with the transfer ratio T) is proportional to the α component of the rotor flux ψ. This is a reproduction of the α component of the flux correlated with the rotary field machine 1 according to equation (1) and can be supplied via the line 16 to control system 3 as an operating parameter signal representative of the α component of the flux. Similarly, an operating parameter signal representative of the β component of the flux is supplied to the control system 3 via the line 16'.

By means of these flux components the control system 3 controls the stator voltage in such a way that a certain desired flux value is maintained. The result of this is that at the provided values for the flux the stator voltage is, at decreasing rotational speed of the rotary field machine, controlled toward a decreasing frequency and decreasing amplitude. By way of generalization, therefore, the instrument transformer 5, a current sensor 21 (comprising the current transformer 8 and the proportional stage 10) and an integrating circuit 20 (comprising the integrator 12, the summing point 7 and the proportional stage 11) may be regarded as making up a device for determining an operand ψ' which is correlated with a load fed with a current i and a voltage u decreasing with decreasing frequency, and which reproduces an operational magnitude of the load determined by the voltage u, the current i and a parameter R according to the relation $\psi' = \int (u + R \cdot i)dt$. Where the load, as in FIG. 1, is the rotary field machine 1, u is the α component of the stator voltage vector U, i is the α component of the stator current vector I, R is the negative of the stator resistance r, and ψ' is the α component of the stator flux ψ developed without consideration of the stray voltage x·I.

The device thus includes:

(a) an instrument transformer with its input side connected to receive the load voltage u for forming an input value signal u' correlated with and d-c isolated from the load voltage u;

(b) a current measuring system 21 for determining the load current i, for the formation of an input value signal R·i' which is proportional to the product R·i; and (c) a first integrating circuit 20 for forming a combination of the two input value signals developed by elements (a) and (b).

In the operation of such a device, the input level of the transformer 5 (i.e. the effective phase voltage, where the load is a rotary field machine) drops at low frequencies to such an extent that the transfer error of the instrument transformer 5 becomes greater than the level of the voltage u. The transfer error of the instrument transformer may, for example, be due to a d-c component caused by offset voltages and/or a statistical measurement error caused by measurement inaccuracy. For an input voltage $u_o$ to the transformer, the output signal u' appears as a deviation from the linearity between u' and $u_o$, i.e. it appears as a disturbance voltage Δu in accordance with $$u' = T \cdot u_o + \Delta u = T \cdot u_o \cdot \left(1 + \frac{\Delta u}{T \cdot u_o}\right) \approx T \cdot u_o \left(1 + \frac{\Delta u}{u'}\right)$$

The relative error $$\frac{\Delta u}{u'} \approx \frac{\Delta u}{T \cdot u_o}$$

is dependent on the transfer ratio T and on the instantaneous load voltage $u = u_o$. The transfer ratio is selected, for example, so that the operational amplifiers of the aforementioned circuitry reach their full output voltage of 10 V when the load voltage u reaches its full effective value of 380 V at the nominal frequency of the load, corresponding to a peak voltage of 537 V. In such case, a transfer ratio value of T=0.0186 should be selected. In accordance with the desired accuracy of calculation, for the relative error $$\frac{\Delta u}{u'}$$

with respect to the output voltage u' or $$\frac{\Delta u}{u_o}$$

with respect to the transformer input voltage $u_o$, a corresponding maximum error of $$\left(\frac{\Delta u}{u'}\right)_{max}$$

or respectively $$\left(\frac{\Delta u}{u_o}\right)_{max} = T\left(\frac{\Delta u}{u'}\right)_{max}$$

is permissible. Thus, for the desired accuracy:

$$u > \frac{\Delta u}{T \cdot \left(\frac{\Delta u}{u'}\right)_{max}} = \frac{\Delta u}{\left(\frac{\Delta u}{u_o}\right)_{max}}$$

For relatively low frequencies this condition is not met and faulty determinations of the flux signal ψ' may result. If, however, the load voltage u were amplified at the instrument transformer input by the factor k (i.e. if $u_o = k \cdot u$), then $$u' = (T \cdot u_o + \Delta u) = k \cdot T \cdot u \left(1 + \frac{\Delta u}{T u_o}\right)$$

The maximum permissible relative error is now exceeded only when the transformer input voltage $u_o = k \cdot u$ falls below the value $$\Delta u / \left( \frac{\Delta u}{u_o} \right)_{max}.$$

The range of permissible load voltages is now given by the condition $$u_o > \frac{\Delta u}{\left( \frac{\Delta u}{u_o} \right)_{max}} \text{ or } u > \frac{1}{k} \cdot \frac{\Delta u}{\left( \frac{\Delta u}{u_o} \right)_{max}}$$

If, therefore, the device is to be operated to a lower limit frequency $\omega_{min}$ or respectively to the corresponding lower load voltage $u_{min}$, the value $$k = \frac{\Delta u}{u_{min}} / \left( \frac{\Delta u}{u_o} \right)_{max}$$

must be selected for k in accordance with the absolute transfer error $\Delta u$ and the maximum permissible relative transfer error $$\left( \frac{\Delta u}{u_o} \right)_{max}$$

with respect to the transformer input voltage $u_o$. On the other hand, the transformer output voltage $u' = k \cdot T \cdot u$ must not exceed the voltage limit level of the after-connected circuitry (e.g. 10 V). The amplification (multiplication) of the load voltage u by the factor k should therefore be effected only at low frequencies.

In accordance with the invention, the elements (a) to (c) listed above are supplemented, as follows:

(d) a second integrating and amplifying circuit 4 is connected between the load voltage line u and the instrument transformer 5, having a transfer function selected to amplify low frequency load voltage inputs to the transformer 5, without affecting the high frequency (greater) load voltage inputs. A preferred transfer function is $k/(1+s \cdot k/\omega_N)$, where s is a laplacian operator, $\omega_N$ is a given reference frequency of the load introduced for normalizing reasons, and k is a given proportionality factor selected in accordance with the lower frequency range condition $$k > \frac{\Delta u}{u} / \left( \frac{\Delta u}{u_o} \right)_{max} ;$$

(e) the design of the first integrating circuit 20 (element (c) above) is modified so that it forms the output value $$\omega_N/k \int \cdot (u' + k \cdot R \cdot i') dt$$

(f) the input value u' furnished by the instrument transformer 5 and the output value of the first integrating circuit 20 are supplied to a summing point 13 at the output of which the operand $\psi'$ is tapped.

The invention provides for amplification of the load voltage amplitude input to the transformer 5 in a frequency-dependent manner. The selected proportionality factor is small at high frequencies and large at low frequencies. The transmitted signal does not exceed the permissible voltage level of the after connected circuitry. Suitable circuitry following the transformer is used to compensate for the distortion due to amplification at low frequencies. Since the frequency-dependent signal amplification does not depend on switching a proportional stage, errors due to discontinuities caused by switching from one measurement range to another are not a problem. Range adaptation, as shown in FIG. 1, is achieved by means of an integrating and amplifying circuit. The invention may be implemented with an integrating and amplifying circuit 4 comprising passive component elements, and by appropriate simple distortion compensation following the transformers. The use of circuitry involving intermittent switching to provide the desired proportionality factor is disadvantageous. It would require use on the load voltage side of the transformer 5 of circuit elements which would be difficult to realize, e.g. the use of switches and operational amplifiers adapted to the high load voltage levels prevailing at full modulation. The phase shift in the input signal by the integration circuit 4 can be removed by appropriate compensating measures following the transformer.

Considering the frequency response of the first integrating circuit 20 together with the addition at the summing point 13, we obtain for this transfer state the transfer function $$u' + (\omega_N/k) \cdot 1/s \cdot (u' + k \cdot R \cdot i') =$$

$$\frac{\omega_N}{s} \left( \left( \frac{1 + s \cdot k/\omega_N}{k} \right) \cdot u' + R \cdot i' \right)$$

It can thus be seen that introducing the voltage signal u' at the summing point 13 serves to compensate for the frequency response of the second integrating and amplifying circuit 4 which has the transfer function $k/(1+s \cdot k/\omega_N)$.

For the specific case of the rotary field machine 1 (shown in FIG. 1) where the operational magnitude $\psi$ of the rotor flux also takes into consideration the stray voltage $-x \cdot I$, the output value of the current measuring system can be supplied with the weight $k \cdot R$ (corresponding to the stator resistance $r = -R$) to the summing point 7 and with the weight X (corresponding to the stray inductance $x = -X$) by means of the proportional stage 15 to the summing point 13. It is possible to eliminate one of the two proportional stages 10 and 15 of FIG. 1 through incorporation by suitable transfer ratio selection into the current transformer 8 or the coordinate translator 9.

As already mentioned, the integrating and amplifying circuit 4 can be constructed from passive elements and may have an amplification factor between 0 and 1, i.e. an attenuation. An example of such construction is the parallel capacitor and resistor arrangement at the input of the optocoupler 30 shown in FIG. 2. The output voltage signal u' of the optocoupler 30 is d-c isolated from the input voltage. Its magnitude is determined by the amplification ratio of the optocoupler 30, which at an input current $I_{in}$ of 0.01 m produces the desired voltage level of 10 V for full modulation at nominal frequency (50 Hz). The transfer ratio of the optocoupler is thus given by $10V/\sqrt{2} \cdot 380V = 0.0186$. With decreasing input voltage of the optocoupler the influence of the measurement error increases and at an input voltage of about 53.7 V (10% of the nominal voltage) for the optocoupler, it reaches the maximum permissible relative error. Without the use of the integrating circuit 32 in accordance with the invention, the maximum relative error would be reached at a frequency of about 5 Hz. By wiring the input of the optocoupler with the resistors R1 to R4 and the capacitor C, however, the load voltage is increased by the factor k at frequencies under about 5 Hz, so that the maximum permissible transfer error is not reached until a much lower frequency 5/k Hz is reached. By way of example, a value k=10 may be obtained by achieving the passive, integrating input wiring of the optocoupler shown in FIG. 2 through components having the values: $R_1=1.6$ M ohms, $R_2=47$ k ohms, $R_3=66$ k ohms, $R_4=56$ k ohms and $C=1$ μF. Using this arrangement, the maximum control range can be expanded to a lower limit frequency of 0.5 Hz which corresponds to an effective load voltage of 3.8 V.

Figure 2:
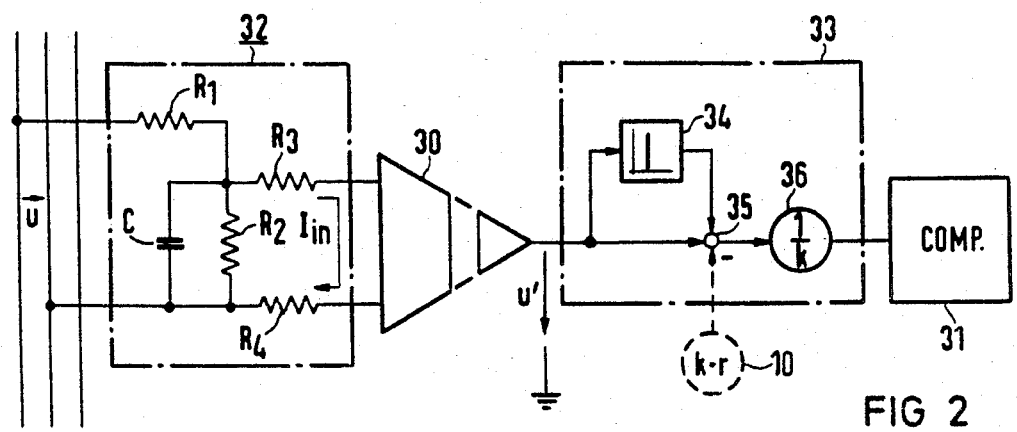
FIG. 2 is another embodiment of the device of FIG. 1.

The optocoupler 30 as shown in FIG. 2 is used to provide load voltage isolation in a load voltage transfer ratio in the same manner the instrument transformer provides in FIG. 1 and hereinafter optocoupler 30 shall also be referred to by the terms instrument transformer and transformer. It is connected to supply signals to a computing circuit 31. Unlike the integrating circuit 20 of FIG. 1, the computing circuit 31 need not comprise an integrator for the voltage u' tapped at the instrument transformer output. In such case, however, compensation of the frequency response of the integrating circuit 32 preceding the instrument transformer 30 cannot be done in the simple manner discussed above in reference to FIG. 1. The circuitry of FIG. 2, like that of FIG. 1, is used to determine an operating parameter signal that is correlated with a measuring voltage u which decreases with decreasing frequency. The integrating circuit 32 in FIG. 2 serves the same purpose as the integration 4 in FIG. 1 regarding the problem that the transfer error of the instrument transformer 30 may exceed the permissible maximum relative measurement for voltages u corresponding to low frequency operation. The integrating circuit 32 has a transfer function $$k/\left(1 + s \cdot \frac{k}{\omega_N}\right),$$

with the proportionality factor k being selected (as for integrator and amplifier 4 of FIG. 1 discussed above) so that at low frequencies the output voltage of the integrating circuit amplified by the factor k is greater than the quotient of the absolute measurement error and the maximum permissible relative error.

A differentiating circuit 33 is connected between the output side of the transformer 30 and the input of the computing circuit 31 and has a time response $1/k(1+s \cdot k/\omega_N)$. The differentiating circuit 33 serves to supply the voltage u' from the transformer 30 directly, on the one hand, and indirectly via a differentiating stage 34 having a transfer function $s \cdot k/\omega_N$, on the other hand, to a summing point 35. The differentiating stage 34 and the summing point 35 act as a lead stage and therefore can be constituted by a single component. A proportional stage 36 is connected at the output of the summing point 35 to compensate for the effects of the proportional amplification performed by the integrating circuit 32. This proportional stage 36 may be consolidated into the computing circuit 31 by suitable input wiring.

If desired, the computing circuit 31 may comprise an integrator, such as the integrator 12 of FIG. 1. In such case, the circuitry of FIG. 2 can be used to provide field-oriented control for a rotary field machine. The ohmic stator voltage drop can be considered by supplying an appropriate additional signal to the summing point 35, in the manner accomplished by the proportional stage 10 of FIG. 1.

Having thus described the invention with particular reference to the preferred forms thereof, it will be obvious to those skilled in the art to which the invention pertains, after understanding the invention, that various changes and modifications may be made therein without departing from the spirit and scope of the invention as defined by the claims appended hereto. It will be appreciated that the selection, connection and layout of the various components of the described configurations may be varied to suit individual tastes and requirements.

What is claimed is:

1. Device for determining an operating parameter signal for a load fed by a current i and a voltage u which decreases with decreasing frequency said operating parameter defined by $\int(u' + Ri') dt$ correlated to a proportionality factor R, comprising:

an integrating and amplifying circuit connected to amplify the load voltage u in accordance with a transfer function $k/(1 + s \cdot k/\omega_N)$, where s is a laplacian operation, $\omega_N$ is a given reference frequency of the load, and k is a proportionality factor;

a transformer connected to receive the amplified load voltage signal at its input and to provide a d-c isolated voltage signal u' at its output which is proportional to the voltage u;

a current measuring system for determining the load current i, for forming the isolated signal i', and for forming a signal $R \cdot i'$;

a post-transformer integrating circuit connected to receive the u' and $R \cdot i'$ signals and to develop an output signal corresponding to the value $\omega_N k \cdot \int(u' + k \cdot R \cdot i') dt$;

summing point means for summing the u' signal and the output signal of the post-transformer integrating circuit to provide the operating parameter signal;

wherein the proportionality factor k is chosen so that even at low frequencies the voltage u amplified in accordance with the proportionality factor k is greater than the quotient of the absolute measurement error and the maximum permissible relative transfer error $(k \cdot u > \Delta u/(\Delta u/u_{o\ max}))$ relative to a transformer input voltage $u_o$.

2. A device as defined in claim 1, said operating parameter further defined by $\int(u' + Ri') dt + Xi'$ correlated to a proportionality factor X, further comprising:

a proportional stage connected to the current measuring system for developing an output signal $X \cdot i'$ which is correlated with the product of the current i and a proportionality factor X;

and wherein the summing point means comprises means for summing the u' signal, the $X \cdot i'$ signal and the output signal of the post-transformer integrating circuit.

3. A device for determining an operating parameter signal which is correlated with a measuring voltage u which decreases with decreasing frequency, comprising;

an integrating and amplifying circuit connected to receive the voltage u and amplify it in accordance with a transfer function $k/(1+s\cdot/\omega_N)$, where s is a laplacian operator, $\omega_N$ is a nominal frequency correlated with normal operation and k is a proportionality factor;

a transformer connected to receive the amplified voltage output at its input side;

a differentiating circuit having a time response $(1/k)\cdot(1+s\cdot k/\omega_N)$ connected to the transformer output; and a computing circuit connected to the differentiating circuit output;

wherein the proportionality factor k is selected in such a way that the voltage u amplified by the proportionality factor k is greater than the quotient of the absolute transfer error $\Delta$ u and the maximum permissible relative transfer error for the transformer;

whereby operation of the computing circuit is improved at low frequencies at which the absolute transfer error of the transformer is greater, referred to the voltage u, than the permissible maximum relative transfer error of the transformer referred to the transformer input voltage $u_o$.

4. A device as defined in any of claims 1 to 3 usable as a flux computer for determining an operating parameter signal which is correlated with the flux of a rotary field machine.

5. A device as defined in claim 1 or claim 2, wherein the proportionality factor R is proportional to the negative of the stator resistance.

6. A device as defined in claim 5, wherein the proportionality factor X is proportional to the negative of the stray inductance of the stator.

* * * * *